United States Patent [19]

Weng et al.

[11] Patent Number: 6,140,693

[45] Date of Patent: Oct. 31, 2000

[54] METHOD FOR MAKING METAL CAPACITORS FOR DEEP SUBMICROMETER PROCESSES FOR SEMICONDUCTOR INTEGRATED CIRCUITS

[75] Inventors: Jiue Wen Weng; Ruey-Yun Shiue, both of Hsin-Chu, Taiwan

[73] Assignee: Taiwan Semiconductor Manufacturing Company, Hsin-Chu, Taiwan

[21] Appl. No.: 09/345,356

[22] Filed: Jul. 1, 1999

Related U.S. Application Data

[62] Division of application No. 09/044,761, Mar. 20, 1998, Pat. No. 5,946,567.

[51] Int. Cl.[7] .................................................. H01L 29/00
[52] U.S. Cl. .......................................... 257/532; 257/535
[58] Field of Search .................................... 257/532, 535, 257/534, 533; 438/396, 692, 697, 626, 631, 633, 637, 957

[56] References Cited

U.S. PATENT DOCUMENTS

| 5,338,701 | 8/1994 | Hsu et al. | 438/210 |
|---|---|---|---|
| 5,554,558 | 9/1996 | Hsu et al. | 438/253 |
| 5,571,746 | 11/1996 | Pan | 438/612 |
| 5,614,111 | 3/1997 | Lavene | 219/121.59 |
| 5,624,864 | 4/1997 | Arita et al. | 438/393 |
| 5,917,230 | 6/1999 | Aldrich | 257/532 |
| 5,928,960 | 7/1999 | Greco et al. | 438/692 |

*Primary Examiner*—Steven H. Loke
*Assistant Examiner*—Shouxiang Hu
*Attorney, Agent, or Firm*—George O. Saile; Stephen B. Ackerman

[57] ABSTRACT

A method for making metal capacitors for deep submicrometer processes for integrated circuits is described. The method provides metal capacitors with high capacitance per unit area, low voltage coefficients, and excellent capacitance distribution (uniformity) across the substrate. The method involves depositing a first insulating layer on a substrate having completed semiconductor devices. A first metal layer is deposited and patterned to form bottom electrodes and interconnecting metal lines. A thin capacitor dielectric layer is deposited, and a thin second metal or TiN layer is deposited and patterned to form the top electrodes. A thick second insulating layer is deposited and planarized, and an array of via holes are etched to the top electrodes to provide for low-resistance contacts and via holes for the interconnecting metal lines. A third conducting metal layer is deposited over the second insulating layer and in the via holes, and is patterned to form a thick metal plate over the capacitors to provide low-resistance contacts to the capacitors and concurrently to form the next level of metal interconnections.

7 Claims, 3 Drawing Sheets

METHOD FOR MAKING METAL CAPACITORS FOR DEEP SUBMICROMETER PROCESSES FOR SEMICONDUCTOR INTEGRATED CIRCUITS

This is a division of patent application Ser. No. 09/044,761, filing date Mar. 20, 1998 U.S. Pat. No. 5,946,567, A Method For Making Metal Capacitors For Deep Submicrometer Processes For Semiconductor Integrated Circuits, assigned to the same assignee as the present invention.

BACKGROUND OF THE INVENTION (1) Field of the Invention

The present invention relates to a method for making metal capacitors for ultra large scale integration (ULSI), and more particularly relates to a method for making small metal capacitors with high capacitance per unit area, low contact resistance, and tight distribution across the substrate.

(2) Description of the Prior Art

Capacitors on semiconductor chips are used for various integrated circuit applications. For example, these on-chip capacitors can be used as decoupling capacitors to provide improved voltage regulation and noise immunity for power distribution. These capacitors also have applications in analog/logic circuits.

Typically these capacitors are integrated into the semiconductor circuit when the semiconductor devices are formed on the substrate using one or two doped patterned polysilicon layers used to make the field effect transistors (FETs) and/or bipolar transistor. Alternatively, the capacitors can be fabricated using the multilevels of metal (e.g., Al/Cu) also used to wire up the individual semiconductor devices.

Generally the capacitors can be integrated into the circuit with no or with few additional process steps. The capacitance C for the capacitor is given by the expression $$C = eA/d$$

where e is the dielectric constant, A is the capacitor area, and d is the thickness of the capacitor dielectric layer between the two capacitor electrodes. However, when doped polysilicon layers are used for the capacitor electrodes, the voltage coefficient (delta C/delta V) of the capacitor can be high. That is because the capacitance C is also a function of the space charge layer in the semiconductor material, which is also voltage dependent.

One method of minimizing this voltage coefficient is to heavily dope the polysilicon layers as described in U.S. Pat. No. 5,631,188 to Chang. Chang also forms a silicide layer on the top surface of the capacitor top electrode to reduce the contact resistance and therefore reduce the RC time constant.

Another method is to incorporate a polycide layer in the capacitor bottom electrode to increase the electrical Conductivity to minimize the space charge layer effect as described in U.S. Pat. No. 5,338,701 to Hsu and in U.S. Pat. No. 5,554,538 also to Hsu.

By far the best method of minimizing the voltage coefficient (delta C/delta V) is to use a high electrical conductivity material, such as metal, for forming the capacitor electrodes instead of polysilicon semiconducting layers. The conventional method, with no additional processing steps, uses the intermetal dielectric (IMD) layer as the capacitor dielectric layer. However, for deep submicrometer processes (<0.35 um) the IMD layer is usually chemically/mechanically polished (CMP) back to provide a planar surface on which to pattern distortion-free photoresist patterns and to avoid residue (stringers, rails, etc.) during directional plasma etching to form patterns. Also, the polishing back of a relatively thick oxide results in non-uniform oxide thickness that would result in a undesirable wide spread in capacitance values across the wafer. Further, to minimize the capacitance between the metal lines, the IMD layer must be sufficiently thick to minimize RC delays and cross talk. This is contrary to the capacitor requirements of a thin dielectric layer for high capacitance. One method of making a metal capacitor is described in U.S. Pat. No. 5,624,864 to Arita et al. The method includes two extra masking steps and additional processing steps to form platinum-titanium capacitor electrodes. The method also focuses on heat treatment to improve capacitor oxide reliability. A method for making wound capacitors with increased dielectric break-down voltages is described in U.S. Pat. No. 5,614,111 to Lavene. Another method for making metal capacitors (back end capacitors) with high unit capacitance is described in U.S. Pat. No. 5,571,746 to Pan in which the bottom electrode, composed of doped polysilicon, is formed in a trench in the IMD layer, and a thin capacitor dielectric layer of silicon oxide/silicon nitride/silicon oxide (ONO) or silicon oxide is deposited on the bottom electrode.

There is still a need in the semiconductor industry to form metal capacitors for deep submicrometer technologies having high unit capacitance with low voltage coefficients and low contact resistance.

SUMMARY OF THE INVENTION

A principal object of the present invention is to provide metal capacitors having high capacitance per unit area and tight distribution of capacitance across the substrate.

A second object of this invention is to provide this improved capacitance having a low voltage coefficient on a substrate having a planar surface formed by chemical/mechanical polishing (CMP).

A third object of this invention is to provide capacitors having low contact resistance.

A fourth object of this invention is to provide an improved capacitor which is compatible with the damascene process currently practiced in the semiconductor industry.

In accordance with the objects of the present invention, a method is described for making low-voltage-coefficient metal capacitors, also having a tight distribution in capacitance across a substrate, and compatible with integrated circuits having planarized surfaces by chemical/mechanical polishing (CMP). The method begins by providing a semiconductor substrate having semiconductor devices, such as field effect transistors (FETs) and bipolar transistors, typically formed in part from one or more patterned polysilicon layers in and on the substrate surface. A first insulating layer, such as silicon oxide ($SiO_2$), is deposited and planarized, for example, by chemical/mechanical polishing. A first conducting metal layer, such as an aluminum/copper (Al/Cu) alloy, is deposited and patterned to form the capacitor bottom electrodes and concurrently to form the first level of electrical interconnections. A uniform, thin capacitor dielectric layer having a high dielectric constant is deposited on the substrate and over the bottom electrodes. A relatively thin second conducting layer, such as titanium nitride (TiN) or Al/Cu, is deposited and patterned, leaving portions on the capacitor dielectric layer over the capacitor bottom electrodes. The thin uniform dielectric layer provides capacitors having high capacitance per unit area and tight distribution in capacitance value across the substrate. The high electrical conductivity metal electrodes provide a low voltage coefficient (delta C/delta voltage) with a linear voltage response. A second insulating layer is deposited as the next level of insulation. Alternatively, the second insulating layer can be planarized by CMP to provide a planar surface for the next level of metal interconnections which is required because of the shallow depth of focus (DOF) needed for exposing high-resolution photoresist images. One key feature of the invention is to etch an array of via holes in the second insulating layer to the capacitor top electrodes to minimize contact resistance while avoiding the need for making a large contact opening, which can result in a nonplanar surface. By a first embodiment, a third conducting metal layer, such as an Al/Cu alloy, is deposited over the second insulating layer and in the array of via holes. The metal capacitors having high capacitance with tight distribution and low contact resistance are then completed by patterning the third conducting layer to form metal regions over the capacitor, electrically contacting the capacitor top electrodes through the array of via holes while concurrently forming a second level of electrical interconnections.

By the method of a second embodiment, the second insulating layer is planarized by CMP. The array of via holes are etched through the planar second insulating layer, and conducting plugs, for example composed of tungsten (W), are formed by depositing and polishing back a tungsten layer. Alternatively, the tungsten can be selectively deposited in the via holes. Then a third insulating layer is deposited and recessed to provide openings over the array of metal plugs and a third conducting layer is deposited and CMP back, commonly referred to as the damascene process, to provide the second level of electrical interconnections.

By the method of a third embodiment, a dual damascene process is used to concurrently form the conducting plugs and the second level of electrical interconnections. In this approach the second insulating layer is first planarized, for example, by CMP, and the via holes, which include the array of via holes over the capacitor, are partially etched into the second insulating layer. Then a second photoresist masking step is used to form a recess in the second insulating layer for the second level of electrical interconnections, while concurrently completing the etching of the via holes, including the etching of the array of via holes to the top electrodes of the capacitor. A third conducting metal layer, for example composed of AlCu, is then deposited and CMP back to the surface of the second insulating layer to concurrently form the conducting metal plugs and the second level of electrical interconnections.

BRIEF DESCRIPTION OF THE DRAWINGS

The objects and other advantages of this invention are best understood with reference to the preferred embodiment when read in conjunction with the following drawings.

DESCRIPTION OF THE PREFERRED EMBODIMENTS

Figure 1:
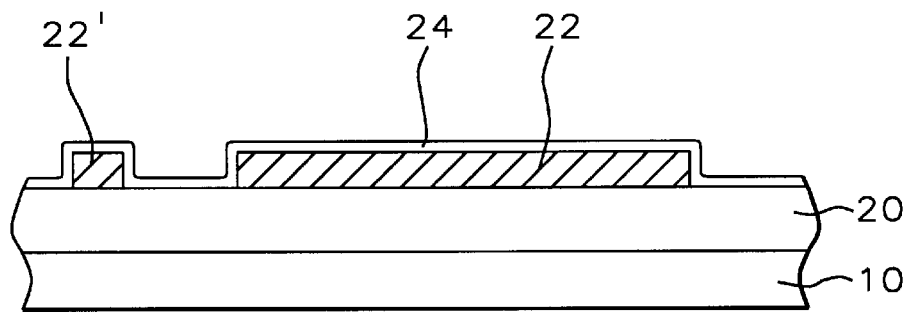
FIGS. 1 through 4 show schematic cross-sectional views for the sequence of process steps for forming metal capacitors having high capacitance per unit area and low voltage coefficient by the method of a first embodiment

The present invention relates to a method for making on-chip metal capacitors with high capacitance and low contact resistance, and concurrently forming two levels of metal interconnections for integrated circuits on a semiconductor substrate. The method utilizes one additional masking step for forming the metal capacitors, which is considerably superior to the conventional prior-art method of using the intermetal dielectric (IMD) layer as the capacitor dielectric. The semiconductor devices, which are not shown in the drawings to simplify the drawings and the discussion, are typically FETs or bipolar transistors. These capacitors can also be used with other types of semiconductor devices depending on circuit requirements.

Starting with FIG. 1, a schematic cross-sectional view is shown of a portion of a semiconductor substrate. The method begins by depositing a first insulating layer 20 on the substrate 10, which has semiconductor devices (not shown), such as field effect transistors (FETs) and bipolar transistors. The first insulating layer is preferably silicon oxide ($SiO_2$), and is deposited by low-pressure chemical vapor deposition (LPCVD) using tetraethosiloxane (TEOS) as the reactant gas. Insulating layer 20 is deposited to a thickness of between about 7000 and 13000 Angstroms. Alternatively, layer 20 can be deposited to a thickness greater than 13000 Angstroms and planarized to provide a thickness of between about 7000 and 13000 Angstroms. Layer 20 can be planarized, for example, by chemical/mechanical polishing (CMP).

Still referring to FIG. 1, a first conducting metal layer 22 is deposited. Preferably first conducting layer 22 is an aluminum/copper (Al/Cu) alloy and is deposited by physical vapor deposition (PVD) to a thickness of between about 4000 and 8000 Angstroms. Layer 22 is then patterned using conventional photolithographic techniques and anisotropic plasma etching to form bottom electrodes 22 and concurrently to form the first level of electrical interconnections, such as portion 22' in FIG. 1. The plasma etching can be carried out, for example, in a reactive ion etcher using an etchant gas containing chlorine ($Cl_2$) that etches Al selectively to CVD $SiO_2$.

Continuing with FIG. 1, a uniform, thin capacitor dielectric layer 24 is deposited over the bottom electrodes 22. Preferably layer 24 is a $SiO_2$ deposited by CVD to a thickness of between about 100 and 1000 Angstroms. Alternatively, high dielectric constant materials can be used to further enhance the capacitance. For example, silicon oxide/silicon nitride/silicon oxide (ONO) can be used for layer 24 with a thickness of between about 100 and 1000 Angstroms. This thin uniform dielectric layer 24 serves as the capacitor dielectric layer to provide a high capacitance per unit area. Also, the thin layer 24 is uniform across the substrate, and therefore provides a tight distribution in capacitance values across the substrate. Alternatively, dielectric layer 24 can be composed of silicon oxide ($SiO_2$), silicon nitride ($Si_3N_4$) and other high dielectric constant materials such as tantalum pentoxide ($Ta_2O_5$) and the like.

Figure 2:
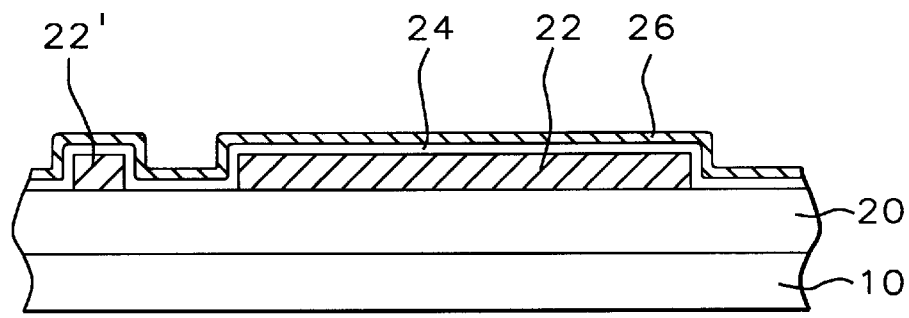

Referring to FIG. 2, a relatively thin second conducting layer 26 is deposited on layer 24 for forming the top electrodes for the capacitors. Layer 26 is preferably a titanium nitride (TiN) layer having a thickness of between about 500 and 1000 Angstroms. The TiN can be deposited, for example, by reactive sputter deposition of a Ti target in the presence of nitrogen. The TiN can also be deposited by chemical vapor deposition (CVD). Alternatively, other good electrical conductors, such as metals, can be used for layer 24, such as Al/Cu, Cu, or tungsten (W). Typically the Al/Cu is deposited by PVD to a thickness of about 500 to 1000 Angstroms.

Figure 3:
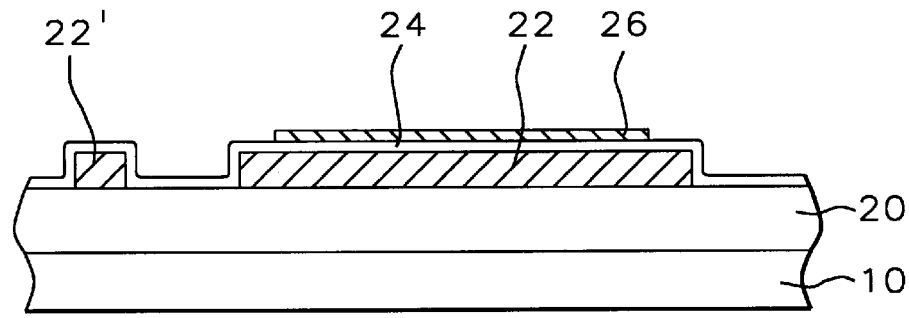

Referring now to FIG. 3, the second conducting layer 26 is patterned to form the top electrodes 26 by leaving portions on the capacitor dielectric layer 24 over the capacitor bottom electrodes 22, while removing layer 26 elsewhere on the substrate. Layer 26 is preferably patterned using plasma etching that has a high etch-rate selectivity of the second conducting layer 26 to the capacitor dielectric layer 24, and preferably having an etch-rate ratio greater than 3:1. For example, the Al/Cu can be etched using high-density plasma (HDP) etching and an etchant gas containing Cl, and the TiN can be etched using a reactive ion etcher (RIE) or HDP etcher and an etchant gas such as boron trichloride ($BCl_3$) or $Cl_2$. Because the top electrodes 26 have high electrical conductivity, they avoid the space-charge effect associated with polysilicon electrodes cited in the prior art, and therefore provide a much lower voltage coefficient (delta C/delta voltage) and a much improved linear voltage response.

Figure 4:
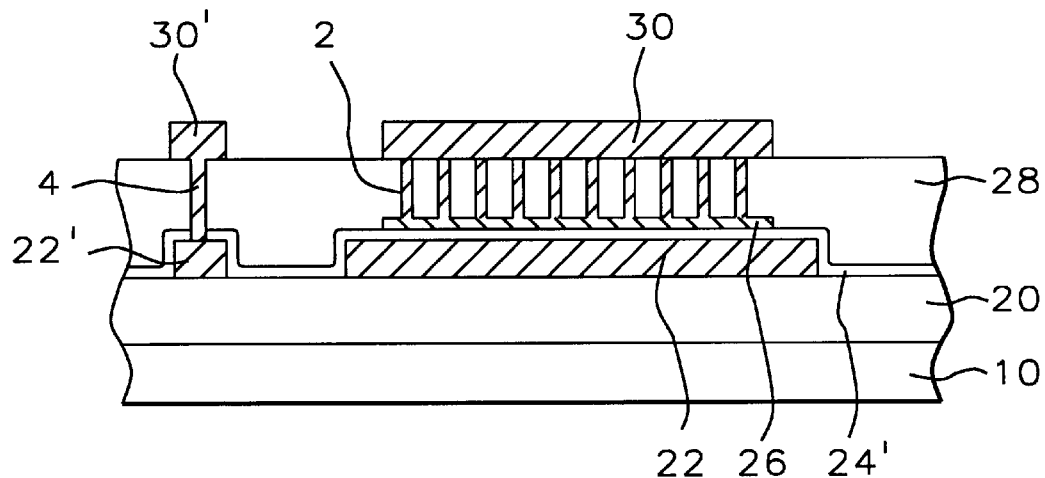

Continuing with the process, and as shown in FIG. 4, a relatively thick second insulating layer 28 is deposited to a thickness of between about 20000 and 24000 Angstroms to form an intermetal dielectric (IMD) layer. Layer 28 is preferably a $SiO_2$ or borophosphosilicate glass (BPSG) and is deposited by LPCVD. For example, the $SiO_2$ can be deposited by TEOS/ozone ($O_3$), and the BPSG can also be deposited by TEOS/$O_3$ with in-situ doping using diborane hydride ($B_2H_6$) and phosphine ($PH_3$) as the dopant gases. Alternatively, layer 28 can be planarized using CMP to a thickness of between about 6500 and 13500 Angstroms over the metal. Conventional photolithographic techniques and anisotropic plasma etching are then used to etch contact openings 2 to the top electrodes 26, and concurrently to etch via holes 4 in layer 28 for interconnecting metal lines, such as via hole 4 to the first metal 22' in FIG. 4.

One key feature of this invention is to etch an array of narrow, closely spaced via holes 2 in the second insulating layer 28 to the capacitor top electrodes 26 to minimize contact resistance.

Referring still to FIG. 4, a third conducting metal layer 30, such as Al/Cu alloy, is deposited over the second insulating layer 28 sufficiently thick to fill the array of via holes 2 and to fill the via holes 4 for the interconnecting metal lines. The Al/Cu layer 30 can be deposited by a variety of methods, for example, by PVD or CVD. As will be shown in a second embodiment, the via holes can be filled with a different metal, such as tungsten (W) to form tungsten plugs.

Continuing with the first embodiment and as shown in FIG. 4, the conducting layer 30 is patterned by conventional means to form the interconnecting lines, as depicted by 30', and also to pattern layer 30 over the array of via holes 2 to form good electrical contacts 30 to the top electrodes 26 for the capacitors. The contacts to the bottom electrodes 22 of the capacitors are not depicted in FIG. 4, but would typically be provided by the patterned interconnecting lines formed from the first and third conducting metal layers 22 and 30.

Figure 5:
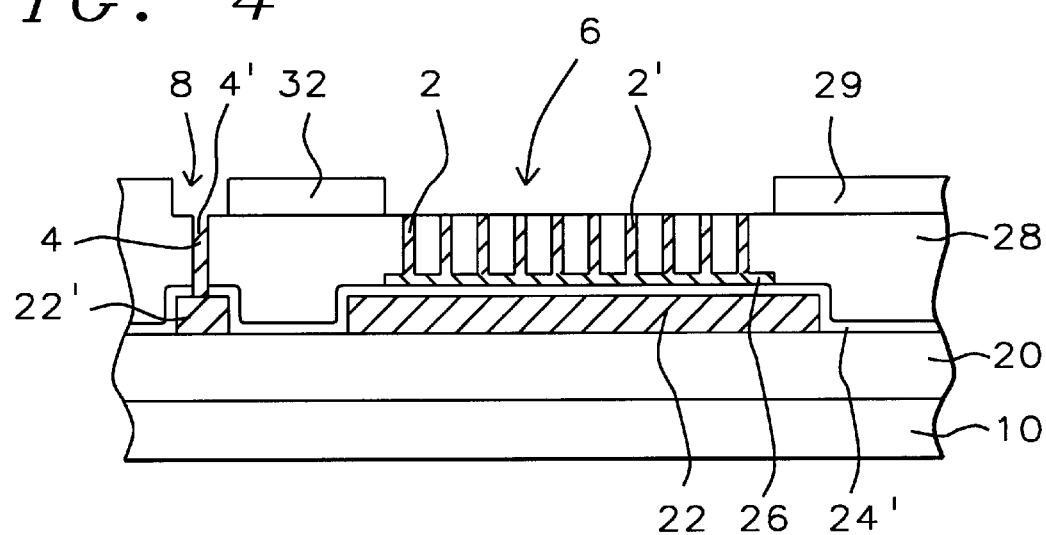
FIGS. 5 and 6 show schematic cross-sectional views for the sequence of process steps for forming metal capacitors having high capacitance per unit area and low voltage coefficient by the method of a second embodiment
Figure 6:
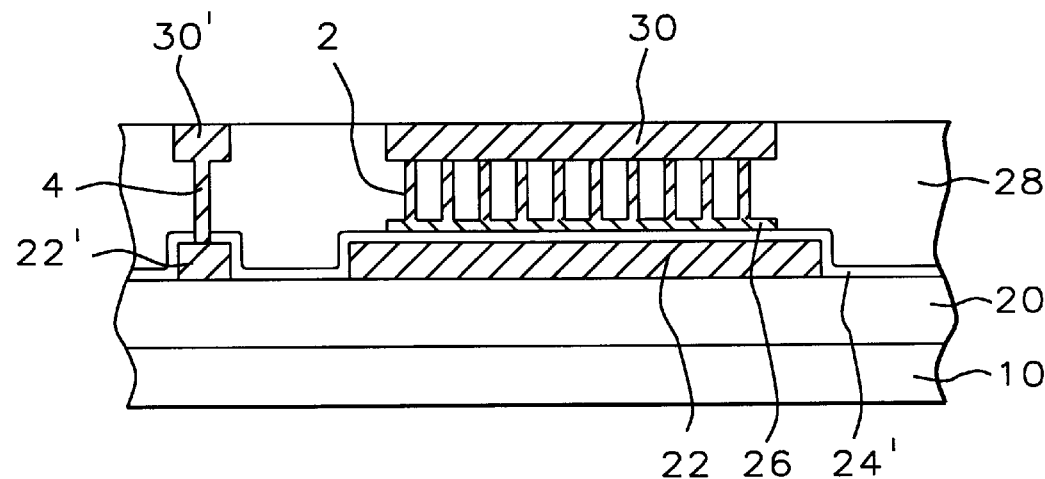

Referring to FIGS. 5 and 6, a second embodiment is shown for forming the second level of electrical interconnections and having conducting metal plugs in the via holes 2 formed separately from a different conducting material using a damascene process. The process is identical to the first embodiment up to and including the deposition of the second insulating layer 28. Continuing with the second embodiment, the second insulating layer 28 is planarized using CMP to provide a planar surface for the second level of metal interconnections. This planar surface is required because of the shallow depth of focus needed to expose the high-resolution photoresist images. The array of via holes 2 are etched in the second insulating layer 28 to the capacitor top electrodes 26, and concurrently the via holes 4 are etched to the interconnecting metal lines 22', as shown in FIG. 5. Conducting plugs 2' and 4' are formed in the via holes 2 and 4. Preferably the conducting plugs are formed by depositing a metal, such as tungsten (W), to fill the via holes. For example, one method of forming the plugs is to selectively deposit the tungsten in the via holes using CVD and tungsten hexafluoride ($WF_6$) as the reactant gas. Alternatively, a blanket W layer can be deposited and plasma etched or CMP back to the second insulating layer 28.

Still referring to FIG. 5, a third insulating layer 29 is deposited and recessed to provide openings 6 over the array of metal plugs 2' and openings 8 over metal plugs 4'. Layer 29 is preferably a silicon oxide deposited by CVD using TEOS/$O_3$ as the reactant gas mixture. Layer 29 is deposited to a thickness that is equal to the desired thickness of the second level of electrical interconnections, more specifically to a thickness of between about 5000 and 10000 Angstroms. Preferably the third insulating layer 29 is patterned using conventional photolithographic techniques and anisotropic plasma etching.

Referring to FIG. 6, the second level of electrical interconnections and the low resistance metal contacts to the top electrodes 26 of the capacitors are formed from a third conducting layer 30 using a damascene process. Layer 30 is preferably an Al/Cu alloy and is deposited by physical vapor deposition (PVD) to a thickness that is greater than the thickness of the third insulating layer 29, and more specifically to a thickness of between about 5000 and 10000 Angstroms. Alternatively other electrically conducting materials, such as Cu, can be used for the third conducting layer. Layer 30 is then chemically/mechanically polished back to the third insulating layer 29 to form the second level of electrical interconnections 30' in recesses 8 while forming the low resistance electrical connection 30 in recess 6 for the improved capacitors, as shown in FIG. 6.

Figure 7:
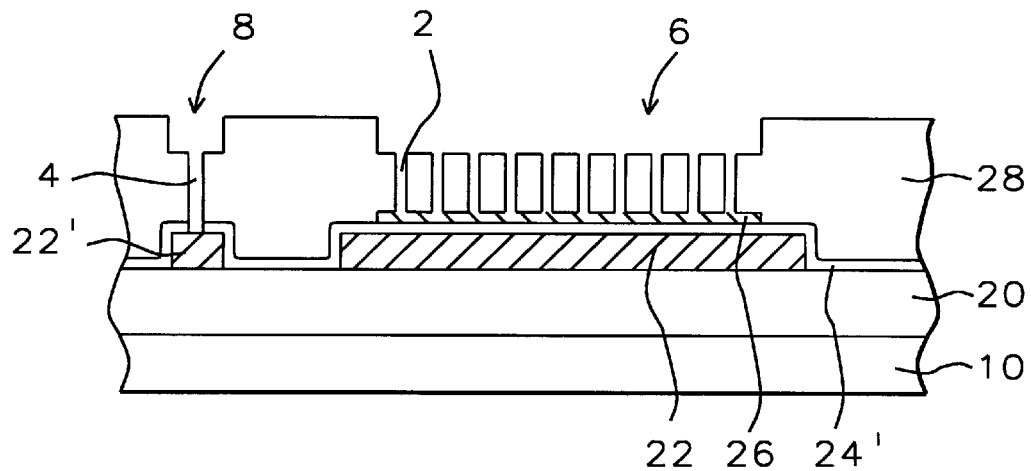
FIGS. 7 and 8 show schematic cross-sectional views for the sequence of process steps for forming metal capacitors having high capacitance per unit area and low voltage coefficient by the method of a third embodiment
Figure 8:
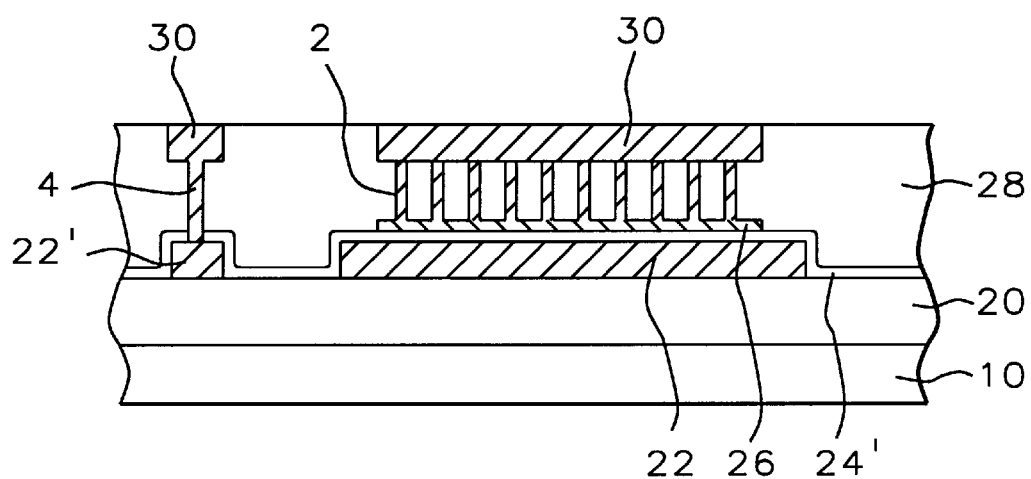

Referring to FIGS. 7 and 8, a method of a third embodiment is described for making these improved capacitors which is compatible with a dual damascene process that is commonly practiced in the semiconductor industry. The method is identical to the first embodiment up to the deposition of the second insulating layer 28. However, layer 28 is deposited sufficiently thickness to accommodate the array of via holes 2 over the capacitor, via holes 4 for the electrical interconnection, and the recess 6 over the array of via holes 2. The second insulating layer 28 is then planarized, for example, by CMP to a thickness of between about 15000 and 20000 Angstroms over the first conducting layer 22. Conventional photolithographic techniques and anisotropic plasma etching is used to partially etch the via holes 4 in the second insulating layer 28, which include the array of via holes 2 over the capacitor composed of the bottom electrode 22 and top electrode 26. A second photoresist masking step and anisotropic plasma etching is used to form the recesses 6 in the second insulating layer 28 for the second level of electrical interconnections, while concurrently completing the etching of the via holes 4, including the array of via holes 2 to the top electrodes 26 of the capacitor, as shown in FIG. 7. The recesses 6 are etched to a preferred depth of between about 5000 and 10000 Angstroms. The etching is carried out in a high density plasma (HDP) etcher and using an etchant gas with a high etch rate selectivity of silicon oxide to silicon to prevent over etching in the via holes. The preferred etchant gas mixture is carbon tetrafluoride ($CF_4$) and hydrogen ($H_2$) or trifluoromethane ($CHF_3$) in a carrier gas such as argon (Ar) or helium (He).

Referring to FIG. 8, the third conducting metal layer 30 is then deposited and CMP back to the surface of the second insulating layer 28 to concurrently form the conducting metal plugs in via holes 4 and 2 and the second level of electrical interconnections 30' over via holes 4 and the patterned metal layer 30 over the capacitor. The metal portion 30 over the array of metal plugs in via holes 2 provide a much improved distributed low resistance contact to the metal capacitor. The third conducting layer 30 is preferably an AlCu alloy, and deposited to a thickness sufficient to fill the via holes 4 and 2 and to fill the recesses 6 to facilitate the chemical/mechanical polishing. For the depth of the recesses 6 sited above the metal layer 30 would be deposited to a thickness of between about 10000 and 15000 Angstroms. Alternatively, other high electrical conductive metal can also be used for layer 30, such as copper (Cu). If required a thin barrier layers such as titanium (Ti), titanium/nitride (TiN) and the like can be deposited prior to depositing and chemically/mechanically polishing back the metal layer 30 and is compatible with making these improved capacitors.

While the invention has been particularly shown and described with reference to the preferred embodiment thereof, it will be understood by those skilled in the art that various changes in form and details may be made without departing from the spirit and scope of the invention.

What is claimed is:

1. A capacitor comprised of:
   a semiconductor substrate having devices formed therein;
   a first insulating layer;
   a first conducting layer on said first insulating layer patterned to provide a capacitor bottom electrode;
   a capacitor dielectric layer on said capacitor bottom electrode;
   a second conducting layer patterned to provide a capacitor top electrode on said capacitor dielectric layer over said capacitor bottom electrode;
   a second insulating layer having an array of via holes distributed over and extending to said capacitor top electrode and said second insulating layer having recesses for a third conducting layer;
   conductive plugs formed in said array of via holes; and,
   a third conducting layer in said recesses in said second insulating layer and electrically contacting said conductive plugs, said third conducting layer in said recesses forming conductive regions over said capacitor providing electrical contacts through said conductive plugs to said capacitor top electrode.

2. The capacitor of claim 1, wherein said third conducting layer is formed of metal.

3. The capacitor of claim 1, wherein said conducting plugs and said third conducting layer are formed of the same metal.

4. The capacitor of claim 1, wherein said conducting plugs and said third conducting layer are formed of different metals.

5. The capacitor of claim 1, wherein said first and said second insulating layers are planar.

6. The capacitor of claim 1, wherein said capacitor is a decoupling capacitor.

7. The capacitor of claim 1, wherein said capacitor forms part of an analog/logic integrated circuits.

* * * * *